(12) United States Patent
Elam et al.

(10) Patent No.: US 7,972,569 B2
(45) Date of Patent: Jul. 5, 2011

(54) CATALYST AND SYSTEMS INCORPORATING THE CATALYST

(75) Inventors: Jeffrey W. Elam, Elmhurst, IL (US);
Michael J. Pellin, Naperville, IL (US);
Joseph A. Libera, Clarendon Hills, IL (US); Peter C. Stair, Northbrook, IL (US); Gerry Zajac, Warrenville, IL (US); Steven A. Cohen, Naperville, IL (US)

(73) Assignee: UChicago Argonne, LLC, Chicago, IL (US)

( * ) Notice: Subject to any disclaimer, the term of this patent is extended or adjusted under 35 U.S.C. 154(b) by 340 days.

(21) Appl. No.: 12/361,377

(22) Filed: Jan. 28, 2009

(65) Prior Publication Data
US 2009/0191101 A1    Jul. 30, 2009

Related U.S. Application Data

(60) Provisional application No. 61/062,963, filed on Jan. 29, 2008.

(51) Int. Cl.
*B01J 8/02* (2006.01)
*B01J 8/18* (2006.01)
*B01J 23/00* (2006.01)

(52) U.S. Cl. ........ 422/211; 422/139; 502/353; 502/305; 502/312; 502/439

(58) Field of Classification Search .................. 422/211, 422/222, 139; 502/353, 305, 312, 439
See application file for complete search history.

(56) References Cited

U.S. PATENT DOCUMENTS
4,077,912 A * 3/1978 Dolhyj et al. ................. 502/178
* cited by examiner

*Primary Examiner* — Walter D Griffin
*Assistant Examiner* — Lessanework Seifu
(74) *Attorney, Agent, or Firm* — Foley & Lardner LLP

(57) ABSTRACT

A catalyst includes a carrier body and a catalytic portion carried by the carrier body. The catalytic portion includes a plurality of distinct layers of catalytic material, which layers may be deposited through atomic layer deposition techniques. The catalyst may have a selectivity for the conversion of alkanes to alkenes of over 50%. The catalyst may be incorporated in a reactor such as a fluidized bed reactor or a single pass reactor.

20 Claims, 9 Drawing Sheets

CATALYST AND SYSTEMS INCORPORATING THE CATALYST

CROSS REFERENCE TO RELATED PATENT APPLICATIONS

The present application claims priority to U.S. Provisional Patent Application No. 61/062,963, filed Jan. 29, 2008 incorporated herein by reference in its entirety.

STATEMENT OF GOVERNMENT INTEREST

The United States Government has certain rights in this invention pursuant to Contract No. W-31-109-ENG-38 between the United States Government and The University of Chicago and/or pursuant to Contract No. DE-AC02-06CH11357 between the United States Government and UChicago Argonne, LLC representing Argonne National Laboratory.

FIELD OF THE INVENTION

This application generally relates to catalysts, methods of forming the catalysts, and reactor systems incorporating the catalysts.

BACKGROUND OF THE INVENTION

This section is intended to provide a background or context to the invention that is, inter alia, recited in the claims. The description herein may include concepts that could be pursued, but are not necessarily ones that have been previously conceived or pursued. Therefore, unless otherwise indicated herein, what is described in this section is not prior art to the description and claims in this application and is not admitted to be prior art by inclusion in this section.

Oxidative dehydrogenation (ODH) catalysis is a current technology used for industrial chemical synthesis with a potential for improved feed stock efficiencies, environmental impact, and energy savings. In particular, the first step of oxidative dehydrogenation of short-chain alkanes (ethane, propane, and butane) is a process which, in its current form, tends to have less than ideal energy consumption and specific conversion.

Given that short chain alkenes represent a primary feedstock for the large scale production of a wide range of industrial materials, this step (and the oxidative dehydrogenation process in general) has a particular interest for development of new catalytic materials.

SUMMARY OF THE INVENTION

A catalyst includes a carrier body and a catalytic portion carried by the carrier body. The catalytic portion includes a plurality of distinct layers of catalytic material, which layers may be formed through atomic layer deposition techniques. Exemplary catalytic materials include catalysts comprising layers of transition metal oxides. The transition metal oxides could include one or more of vanadium oxide, niobium oxide, molybdenum oxide, tungsten oxide, titanium oxide, and zirconium oxide. The catalytic material may also (or alternatively) include one or more other metal oxide materials such as magnesium oxide and aluminum oxide.

The catalyst may be used to catalyze an oxidative dehydrogenation reaction, such as the conversion of alkanes (e.g., short-chain alkanes) to alkenes. The reaction using the catalyst may have a selectivity for the conversion of alkanes to alkenes of over 35%.

The catalyst could additionally (or alternatively) be used in an ammoxidation reaction, such as the conversion of alkanes (e.g., short-chain alkanes) to nitriles.

The catalyst may be incorporated in a reactor such as a fluidized bed reactor or a single pass reactor.

Various aspects of the invention are described hereinafter; and these and other objects of improvements are described in detail hereinafter, including the drawings described in the following section.

DETAILED DESCRIPTION OF EXEMPLARY EMBODIMENTS

Figure 1:
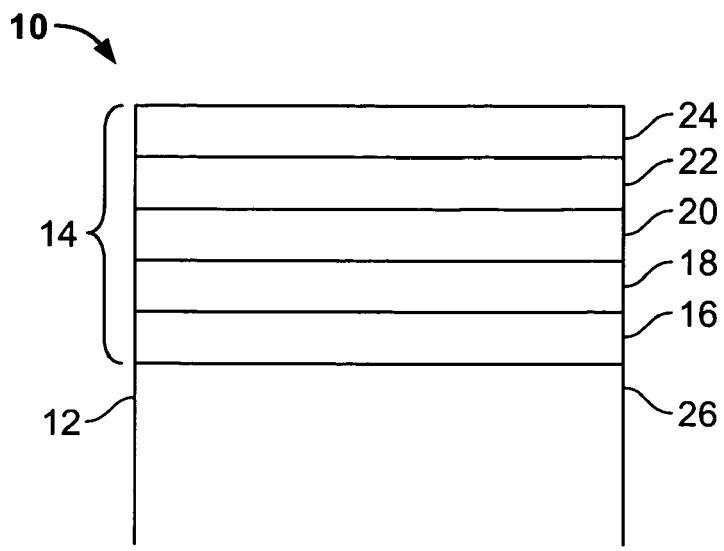
FIG. 1 is a cross section of a portion of an exemplary catalyst according to some embodiments.
Figure 3A:
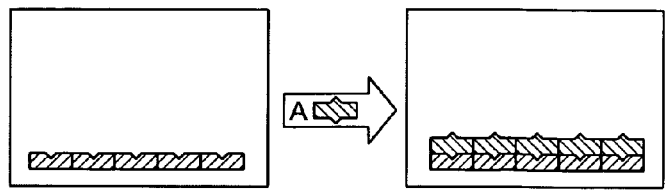
FIGS. 3A and 3B illustrate a layer-by-layer process of forming a multi-layer catalyst according to one exemplary embodiment.
Figure 3B:
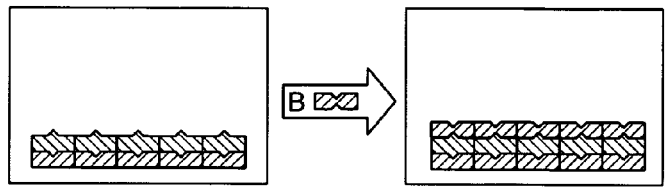

Referring to FIG. 1, new catalysts 10 for oxidative dehydrogenation (ODH), ammoxidation, and/or other processes may include a carrier body 12 which is configured to carry a catalytic material 14. The catalytic material 14 may include two or more layers 16-24 of catalytic material. The layers 16-24 may be deposited using an atomic layer deposition (ALD) (discussed below), and may be deposited monolayer-by-monolayer. See, e.g., FIGS. 3A and 3B. The layers 16-24 may be continuous, complete layers as depicted, or they may be discontinuous, incomplete layers comprised of isolated particles. In some embodiments, some layers may be deposited by ALD while other layers are deposited using some other technique, such as wet impregnation.

The carrier body 12 may be formed as a membrane, as a particle (e.g., a bead or powder), or as some other structure. The carrier body 12 may be a porous body. For example, in some embodiments the carrier body 12 may include a catalytic portion 26 (a portion of carrier body 12 on which the catalytic material 14 is carried) having a surface area, incrementally, of at least 1 m$^2$/g, at least 5 m$^2$/g, at least 10 m$^2$/g, at least 20 m$^2$/g, at least 40 m$^2$/g, at least 60 m$^2$/g, at least 80 m$^2$/g, and/or at least 100 m$^2$/g. In some embodiments, the carrier body 12 may have a surface area, incrementally, of up to about 10000 m$^2$/g, up to 5000 m$^2$/g, up to 1000 m$^2$/g, up to 500 m$^2$/g, up to 250 m$^2$/g, up to 150 m$^2$/g, up to 120 m$^2$/g, up to 100 m$^2$/g, up to 80 m$^2$/g, and/or up to 60 m$^2$/g. In other embodiments, carrier body 12 may have a surface area of more than 10,000 m$^2$/g or less than 1 m$^2$/g.

In embodiments of the carrier body 12 that are porous, the carrier body 12 may have a mean pore diameter, incrementally, of at least 0.1 nm, at least 0.5 nm, at least 1 nm, at least 5 nm, at least 10 nm, at least 15 nm, at least 20 nm, at least 25 nm, at least 30 nm, at least 35 nm, and/or at least 40 nm. In some embodiments of the carrier body 12 that are porous, the carrier body 12 has a mean pore diameter, incrementally, of less than 1 μm, less than 750 nm, less than 500 nm, less than 250 nm, less than 100 nm, less than 50 nm, less than 40 nm, and/or up to about 30 nm. In other embodiments, the carrier body has a mean pore diameter of less than 0.1 nm or more than 1 μm.

If carrier body 12 is a particle, in some embodiments the carrier body 12 may have a primary (e.g., average, median, etc.) and/or minimum (e.g., all or substantially all particles having the minimum) particle size (e.g., diameter, cross-sectional length, etc.), incrementally, of at least 1 nm, at least 10 nm, at least 100 nm, at least 500 nm, at least 1 μm, at least 5 μm, at least 10 μm, at least 20 μm, at least 35 μm, at least 50 μm, at least 65 μm, at least 75 μm, at least 90 μm, at least 100 μm, at least 200 μm, at least 300 μm, at least 500 μm, and/or at least 750 μm. If carrier body 12 is a particle, in some embodiments the carrier body 12 may have a primary and/or maximum (e.g., all and/or substantially all of the particles having the maximum) particle size, incrementally, of up to about 100 mm, up to about 50 mm, up to about 10 mm, up to about 5 mm, up to about 1 mm, up to about 750 μm, up to about 500 μm, up to about 250 μm, up to about 150 μm, up to about 125 μm, up to about 100 μm, and/or up to about 80 μm. If carrier body 12 is a particle, in some embodiments the carrier body 12 may have a primary particle size of more than 100 mm or less than 1 nm.

If the carrier body 12 is a membrane, in some embodiments the carrier body may have an average thickness, incrementally, of at least 1 μm, at least 5 μm, at least 10 μm, at least 25 μm, at least 50 μm, at least 60 μm, at least 80 μm, and/or at least 100 μm. If the carrier body 12 is a membrane, in some embodiments the carrier body may have an average thickness, incrementally, of up to 5 mm, up to 1 mm, up to 500 μm, up to 250 μm, up to 150 μm, up to 100 μm, and/or up to 80 μm. If the carrier body 12 is a membrane, in other embodiments the carrier body may have an average thickness of more than 5 mm or less than 1 μm.

The carrier body 12 may be formed from any material. In some embodiments, the carrier body may be formed from an inorganic and/or non-metallic material. In some of these embodiments, carrier body 12 may include a ceramic material (e.g., may include, incrementally, at least 50, at least 70, and/or at least 90 percent ceramic material by volume). For example, carrier body 12 may include one or more of a silica material, an alumina material, and an aluminum oxide material (e.g., an anodic aluminum oxide material). Carrier body 12 may be formed from more than one material, such as a silica-coated alumina powder, silica coated anodic aluminum oxide membrane, etc.

The catalytic material 14 is carried by the carrier body 12. The catalytic material 14 may be configured to conform to the shape of carrier body 12 (e.g., the catalytic material 14 may have roughly the same shape as the carrier body 12 onto which the catalytic material 14 is deposited). For example, the catalytic material 14 may form a second porous structure over the porous structure of a porous carrier body 12 such that the porous shape formed by the catalytic material 14 is based on and/or similar to (e.g., follows the shape of) the porous structure of the carrier body 12.

The catalytic material 14 may include any catalytic material. In some embodiments, the catalytic material 14 may be a metal oxide material such as a transition metal oxide. For example, the catalytic material 14 may be a Vanadium-based catalytic material (e.g., $V_2O_5$), a Tungsten-based catalytic material (e.g., $WO_3$), a Molybdenum-based catalytic material (e.g., $MO_3$), a Niobium-based catalytic material (e.g., $Nb_2O_5$), a titanium-based catalytic material ($TiO_2$), an aluminum-based catalytic material ($Al_2O_3$), a magnesium-based catalytic material (MgO), and/or a Zirconium-based catalytic material ($ZrO_2$)

The catalytic material 14, may include multiple layers 16-24. In some multi-layer embodiments, the catalytic material 14 may include at least 2 layers, at least 3 layers, at least 4 layers, at least 5 layers, at least 7 layers, at least 9 layers, at least 11 layers, and/or at least 13 layers.

In some embodiments, one or more (e.g., a plurality, at least half, substantially all, and/or all) of the layers 16-24 may have an average and/or maximum thickness, incrementally, of up to about 100 microns, 50 microns, 25 microns, 10 microns, 5 microns, 1 micron, 500 nm, 100 nm, 50 nm, 25 nm, 10 nm, 5 nm, and/or 1 nm. In some embodiments, one or more (e.g., a plurality, at least half, substantially all, and/or all) of the layers 16-24 may have an average and/or maximum thickness of at least about 0.01 nm, 0.05 nm, 0.1 nm, 1 nm, 10 nm, 100 nm, and/or 500 nm. In some embodiments, one or more of the layers 16-24 may meet one set of dimensions listed above, while one or more other layers 16-24 may meet a different set of dimensions listed above. Additionally, individual layers 16-24 may or may not be continuous. In some embodiments, one or more layers 16-24 may consist of isolated atoms or clusters of atoms that are spaced apart from one another such that the average thickness of the layer 16-24 is much less than the thickness of an atom.

In some embodiments, the catalytic material 14 may have an average and/or maximum thickness of up to about 100 microns, 50 microns, 25 microns, 15 microns, 10 microns, 5 microns, 1 micron, 500 nm, 250 nm, 100 nm, 75 nm, 50 nm, 25 nm, and/or 10 nm. In some embodiments, catalytic material 14 has an average and/or maximum thickness of at least about 0.1 nm, 0.5 nm, 1 nm, 5 nm, 10 nm, 25 nm, 50 nm, 100 nm, 250 nm, 500 nm, 750 nm, 1 micron, 5, microns, 10 microns, and/or 25 microns.

The multiple layers 16-24 may be formed from different catalytic materials. For example, one layer 16 may be a $V_2O_5$ layer, while another layer 18 may be a $Nb_2O_5$ layer. Two or more of the multiple layers 16,22 may be formed from the same material (e.g., $V_2O_5$) while at least one other layer 18 (e.g., a layer between the two layers 16,22 formed from the same material) is formed from a different material (e.g., $WO_3$). Each of the layers 16-24 may be essentially pure such that at least 90% and/or at least 95% of each individual layer 16-24 is formed from a common type of material. In some embodiments, the catalytic material 14 includes at least two, at least three, and/or at least four layers 16-24 that are compositionally distinct from each other.

In some embodiments, the catalyst 10 may be configured to catalyze a dehydrogenation reaction (e.g., an oxidative dehydrogenation reaction) and/or an ammoxidation reaction. In some embodiments, the catalyst 10 is configured to catalyze a dehydrogenation and/or ammoxidation reaction of an alkane; particularly a short chain alkane (e.g., $C \leqq 10$, $C \leqq 7$, and/or $C \leqq 4$) such as ethane, propane, and/or butane. The catalyst 10 may have a good selectivity for conversion of an alkane to an alkene. For example, the catalyst may have a selectivity for conversion of an alkane to an alkene, incrementally, of at least about 35%, at least about 40%, at least about 45%, at least about 50%, at least about 60%, at least about 70%, at least about 80%, and/or at least about 90%. In some embodiments, the catalyst may have any of the above listed selectivities while facilitating a conversion rate of reactants to products, incrementally, of at least about 5%, at least about 7%, at least about 10%, at least about 12%, at least about 14%, at least about 16%, at least about 20%, at least about 30%, at least about 40%, at least about 50%, at least about 75%, and/or at least about 90%.

The catalyst 10 may be formed by any number of methods. In many exemplary embodiments, the catalyst can be formed by atomic layer deposition (ALD). ALD utilizes alternating exposures between precursors (e.g., in a gaseous form) and a solid surface to deposit materials in a monolayer-by-monolayer fashion. This process can provide uniformity of the coatings in many embodiments, including on nanoporous substrate materials (e.g., nanoporous carrier bodies 12). In many embodiments, this process also allows good control over the thickness and composition of the coatings.

Figure 2:
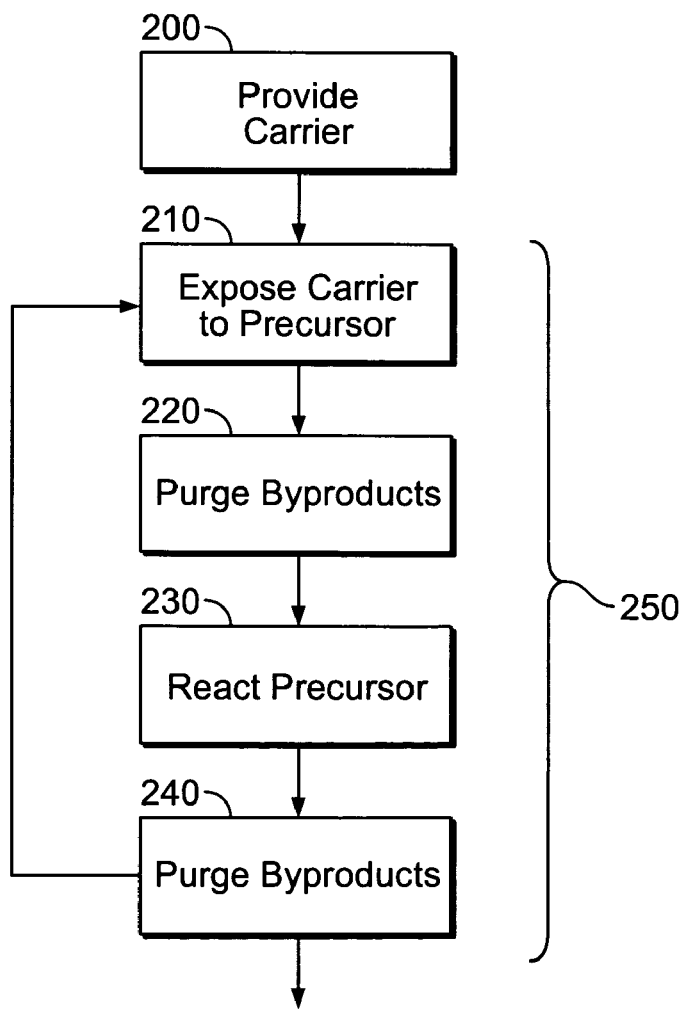
FIG. 2 is a process diagram for making catalysts according to some embodiments.

Referring to FIGS. 1 and 2, to form a catalyst 10 by ALD, the carrier body 12 substrate (e.g., particles, membrane, etc.) is first exposed 210 to a chemical vapor precursor containing the desired metal atom (e.g., trimethyl aluminum). Second, the substrate is purged 220 with an inert gas (e.g., nitrogen) to remove any unreacted precursor as well as gaseous reaction byproducts. Third, the substrate is exposed 230 to a vapor of an oxygen-containing chemical precursor such as water. Finally, the carrier body 12 substrate is again purged 240 with inert gas.

This four-step procedure is referred to as an "ALD cycle 250." For catalysts 10 having multiple layers 16-24 of catalytic material, the ALD cycle 250 can be repeated multiple times to deposit a multilayer film of catalytic material 14 (e.g., metal oxide) which may be used to precisely control the film thickness. In some embodiments, the layers 16-24 of the catalytic material 14 may have quantized thickness (the thicknesses of the layers 16-24 are essentially integers of each other). A majority of the layers 16-24 may have quantized thicknesses, essentially all of the layers 16-24 may have quantized thicknesses, and/or all the layers 16-24 may have quantized thicknesses. Moreover, ALD cycles for different catalytic materials (e.g., metal oxide materials such as $V_2O_5$ and $Nb_2O_5$) can be combined in specific sequences to deposit mixed-catalytic (e.g., metal oxide) layers 16-24 to control the atomic composition of the catalytic material 14.

If multiple ALD cycles 250 are used to deposit multiple layers 16-24, the multiple layers may be provided in a binary manner such that at least some (e.g., at least half) of the layers have a different composition than the adjacent layers.

Figure 6:
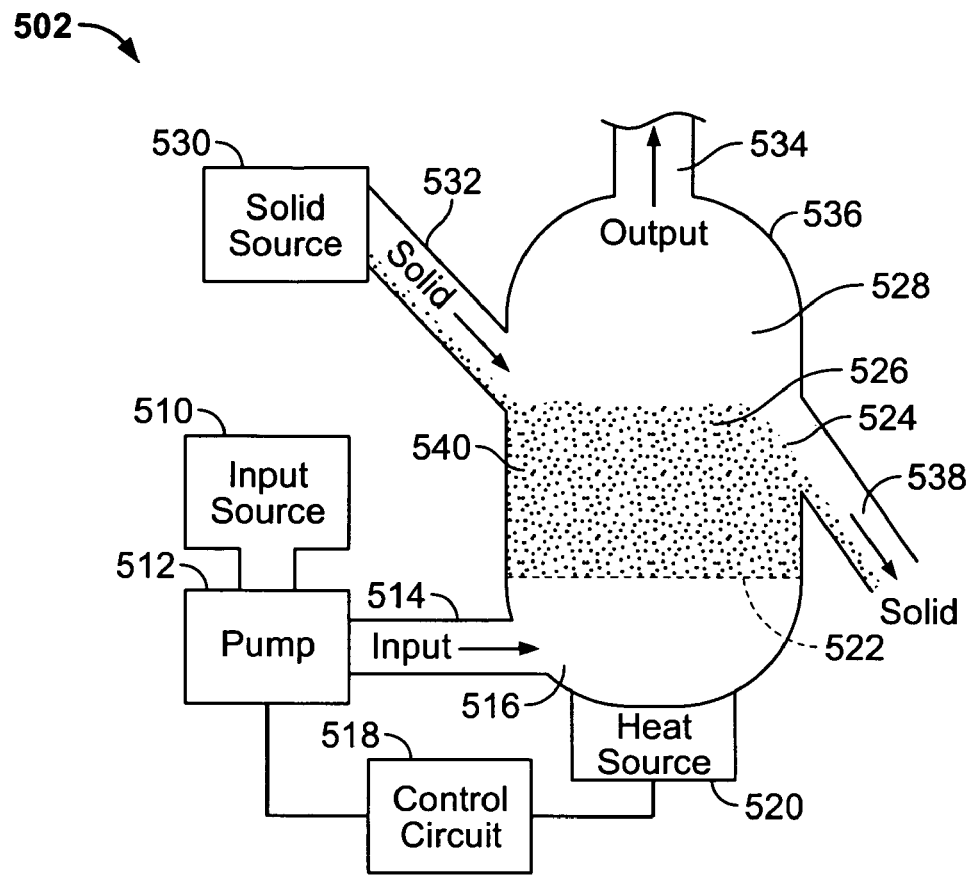
FIG. 6 is a diagram of fluidized bed reactor incorporating catalysts according to one exemplary embodiment.

Referring to FIG. 6, a fluidized bed catalytic reactor 502 includes a solid catalyst 524 fluidized in an upper portion 540 of a fluid 526 contained in a reactor tank 536. The tank 536 also includes a distributor 522 which may be configured to prevent substantially any amount of the catalyst 524 from entering a lower portion 516 of the fluid 526.

An input source 510 (e.g., a container such as tank) contains a material to be catalyzed that is pumped by a pump 512 under the control of a control circuit 518. The material contained in the input source 510 may be any of a variety of materials. The material may be a fluid (e.g., a gas)—in particular a short chain alkane (e.g., $C \leqq 10$, $C \leqq 7$ and/or $C \leqq 4$) fluid material such as ethane, propane, and/or butane. The input source 510 may also include one or more other materials such as a material to promote oxidation (e.g., $O_2$ gas) and/or an inert diluent (e.g., $N_2$). Of course, these additional materials (if used) could also be provided from a separate input source (not illustrated).

The reactant contained in the reactant source 510 is pumped through a channel 514 into a lower portion 516 of the fluid 526. The pumping of the reactant into the fluid 526 may serve to maintain the catalyst 524 in a fluidized state. The reactant pumped into fluid 526 contacts the catalyst 524, and is reacted in a reaction catalyzed by the catalyst 524 in the fluid 526. In some embodiments, catalyst 524 may be configured to catalyze a dehydrogenation reaction (e.g., an oxidative dehydrogenation reaction) and/or an ammoxidation reaction. Reacted (and also possibly unreacted) material exits the tank 536 through an output port 534.

The reactor 502 may be configured to maintain the same catalyst particles in the reaction tank 536, or may be configured to refresh the catalyst in the tank with supplemental catalyst particles. For example, the reactor 502 may include a catalyst source 530 configured to provide supplemental catalyst to the fluid 526 in the tank 536 through a channel 532. The catalyst amount and/or timing of material provided by the source 530 may be controlled by any control structure (e.g., a valve, a belt that transports catalyst, etc.) which may be under the control of a control circuit (e.g., control circuit 518). The reactor 502 may also be configured such that some of the catalyst 524 that is in the fluid 526 is removed from the tank 536. For example, the tank 536 may include a catalyst exit port 538. The fluid surface 528 may be maintained at a level that is at least partially above the starting edge 539 of the exit port 538 such that some of the fluid 526 and the catalyst 524 in the fluid 526 exits through the exit port 538.

The reactor 502 may include any number of other components configured to facilitate reaction of the reactant contained in the reactant source 510. For example, the reactor 502 may include a heater 520 configured to heat the tank 536 and/or the components contained in the tank 536. The heater 520 may also be operated under the control of the control circuit 518.

In some embodiments, the reactor 502 is configured to have, incrementally, at least about 10 g, at least about 50 g, at least about 100 g, at least about 250 g, at least about 500 g, at least about 1 kg, at least about 10 kg, at least about 100 kg, at least about 250 kg, at least about 500 kg, at least about 750 kg, at least about 1000 kg, at least about 5000 kg, at least about 10,000 kg, and/or at least about 25,000 kg of the catalyst 524 in the fluid 526 and/or in the entire system of the reactor 502. In other embodiments, the reactor 502 may have less than 10 g of the catalyst 524 in the fluid 526 and/or in the entire system of the reactor 502.

Figure 7:
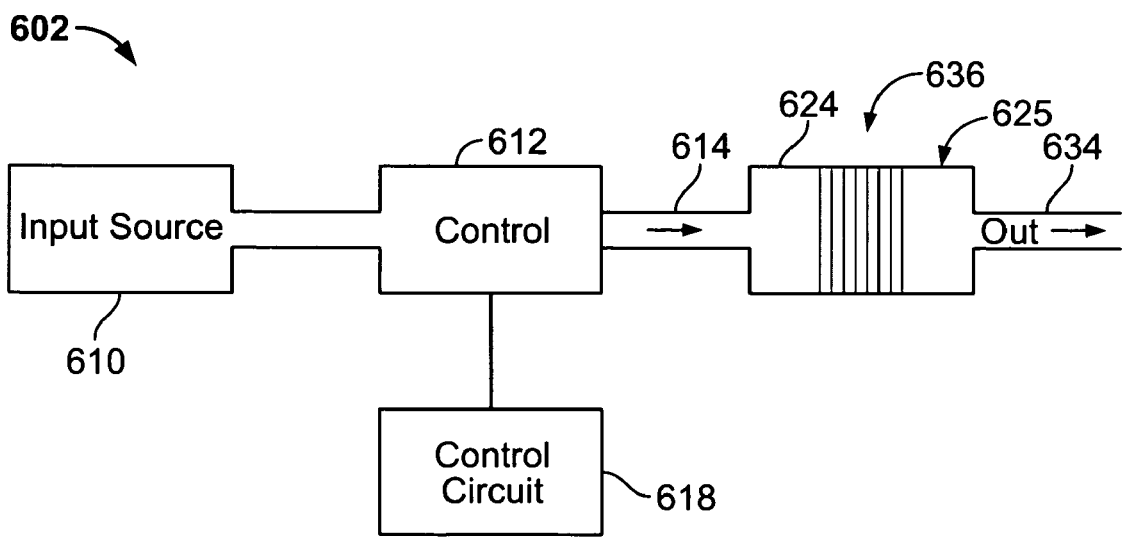
FIG. 7 is a diagram of a pass-through reactor according to one exemplary embodiment.

Referring to FIG. 7, a single pass reactor 602 includes a reactant source 610 configured to provide reactant under the control of a control structure 612 (e.g., valve, pump, etc.) which is controlled by a control circuit 618. Reactant enters a reaction chamber 636 through a channel 614 connected to an inlet 615 of the reaction chamber 638. The reactant pumped into the chamber 636 contacts the catalyst 624 (and/or catalyst 625) which is fixed to an interior surface of the chamber 636. The reactant is reacted in a reaction catalyzed by the catalyst 624. In some embodiments, the catalyst 624 may be configured to catalyze a dehydrogenation reaction (e.g., an oxidative dehydrogenation reaction) and/or an ammoxidation reaction. Reacted (and also possibly unreacted) material exits the chamber 636 through an output port 634. The reactor 602 may include any of the other components of the reactor 502 of FIG. 6, such as the heater 502, the fluid 526, etc.

EXAMPLES

The following non-limiting examples are presented to illustrate the present invention and to assist one of ordinary skill in making and using the same. The examples are not intended in any way to otherwise limit the scope of the invention.

Example 1

As a substrate material, we are using commercial silica gel powder (Silicycle S10040M) with a specific surface area of 100 m$^2$/g, a primary particle size of 75-200 microns, and a nominal pore diameter of 30 nm.

The high surface area silica gel powder was contained in a fixed-bed powder fixture. The bottom tray of this fixture is constructed from 304 stainless steel with dimensions 143 mm×29 mm×3.2 mm deep. The top of the powder fixture is comprised of a 200×600 mesh stainless steel wire cloth cover with 40% open area supported by a perforated stainless steel plate. The fine mesh cover prevents convective gas currents from disturbing the flat powder layer at the bottom of the powder tray while allowing efficient diffusion of reactant and product gases in and out of the powder bed. The dimensions of the powder tray were selected such that the thickness of a silica gel powder layer with a mass of 1.0 g would be ~0.5 mm or ~8 particle diameters while leaving ~2.7 mm of clearance between the powder layer and the cover. By spreading the silica gel powder into a thin layer, we ensure that diffusion of the ALD reactant gases between the silica gel particles is rapid.

The catalysts consist of a mixed oxide of $Nb_2O_5$, $V_2O_5$ and $WO_3$. Each of these oxide materials is deposited by ALD using different precursor combinations, exposure times, and substrate temperatures. These parameters are given in table 1. The quantities in table 1 are applicable to coating 1-gram quantities of the Silicycle S10040M powder substrate.

For example, the procedure for $WO_3$ given in table 1 deposits metallic tungsten to coat the powder substrate. The tungsten coating is formed into tungsten oxide by exposing the tungsten-coated powder to oxygen for 250 seconds at 200° C.

TABLE 1

Parameters for depositing catalytic metal oxide layers by ALD on Silicycle powder.

| Metal Oxide | Metal Precursor | Oxygen Precursor or reducing agent | Substrate Temperature (° C.) | Metal Precursor Exposure Time (s) | Oxygen/Reducing agent Exposure Time (s) |
|---|---|---|---|---|---|
| $V_2O_5$ | Vanadium oxide tri-isopropoxide | Hydrogen peroxide | 100 | 300 | 300 |
| $Nb_2O_5$ | Niobium pentethoxide | Water | 200 | 240 | 120 |
| $WO_3$ | Tungsten hexafluoride | Disilane | 200 | 250 | 250 |

Figure 10A:
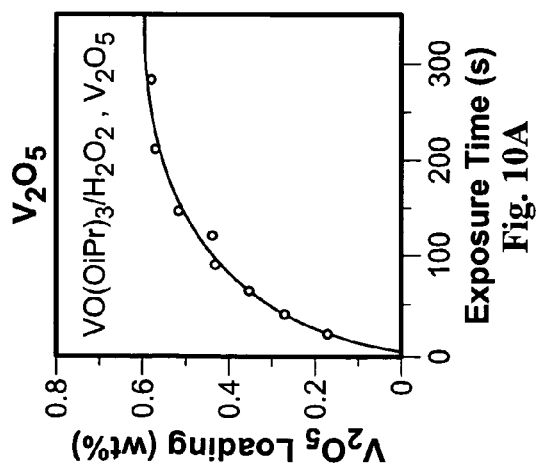
FIGS. 10A-10C are charts illustrating amounts of exemplary catalysts loaded on to a carrier body versus time exposed to the reaction conditions.
Figure 10B:
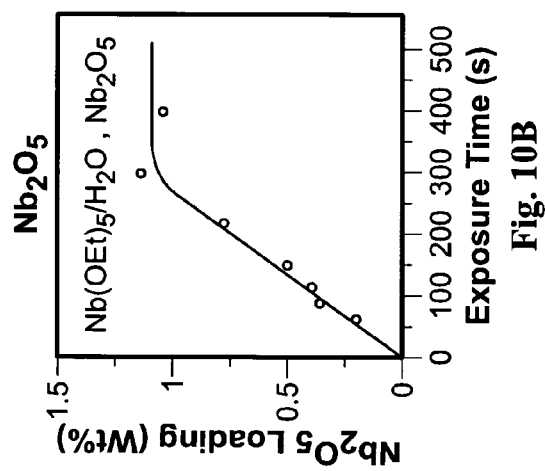
Figure 10C:
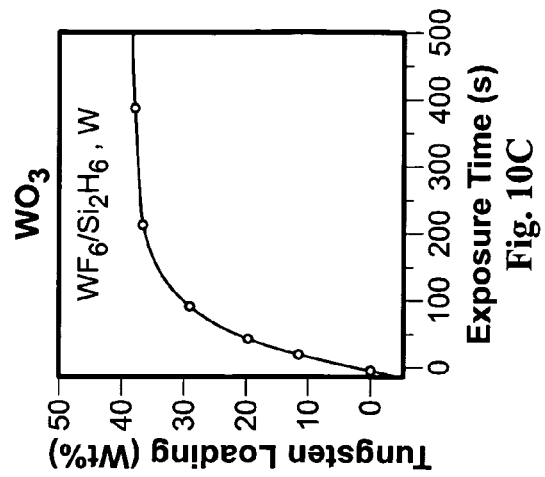
Figure 11:
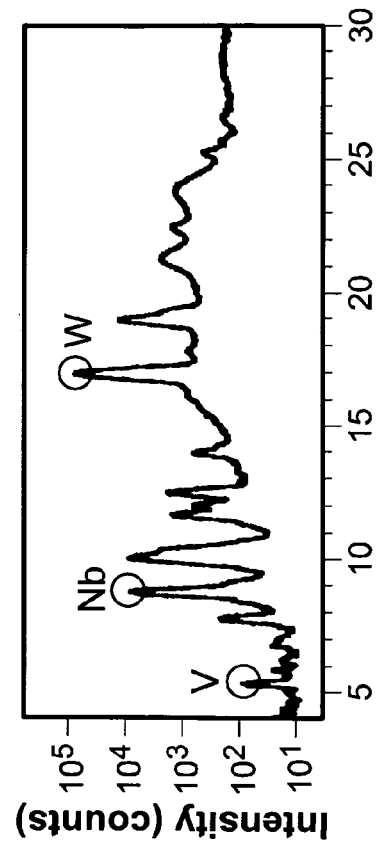
FIG. 11 is a diagram showing that a catalyst includes a Vanadium component, a Niobium component, and a Tungsten component.

FIGS. 10A-C illustrate the loading of these catalysts at different metal precursor exposure times than those listed in Table 1.

Example 2

A set of ALD catalysts were prepared varying the relative amounts of the different metal oxides as shown in Table 2. These catalyst samples were prepared using a silica gel carrier with physical properties very similar to the S10040M described above. These catalyst samples were prepared by depositing the metal oxide layers in the order: $Nb_2O_5$, $WO_3$, $V_2O_5$.

TABLE 2

ALD catalysts prepared for testing

| Catalyst Sample ID Number | $V_2O_5$ Cycles | $Nb_2O_5$ Cycles | $WO_3$ Cycles |
|---|---|---|---|
| JL__006 | 3 | 0 | 0 |
| JL__284 | 1 | 12 | 0 |
| JL__285 | 1 | 12 | 1 |

Example 3

The catalysts of Example 2 were tested for the oxidative dehydrogenation of propane to propylene. Initially the reactivities were surveyed at three space velocities: 0.20, 0.10, and 0.05 wwh (where wwh is in units of grams propane/gram catalyst/hour) at temperatures between 400 and 430° C.

The feed ratios were 1.0 $O_2$/12.0 $N_2$/1.0 propane.

Next, the catalysts were tested using the lowest space velocity with half the nitrogen diluent (feed ratios of 1.0 $O_2$/6.0 $N_2$/1.0 propane) at a temperature of 430° C. The results are shown in FIG. 8.

Figure 8:
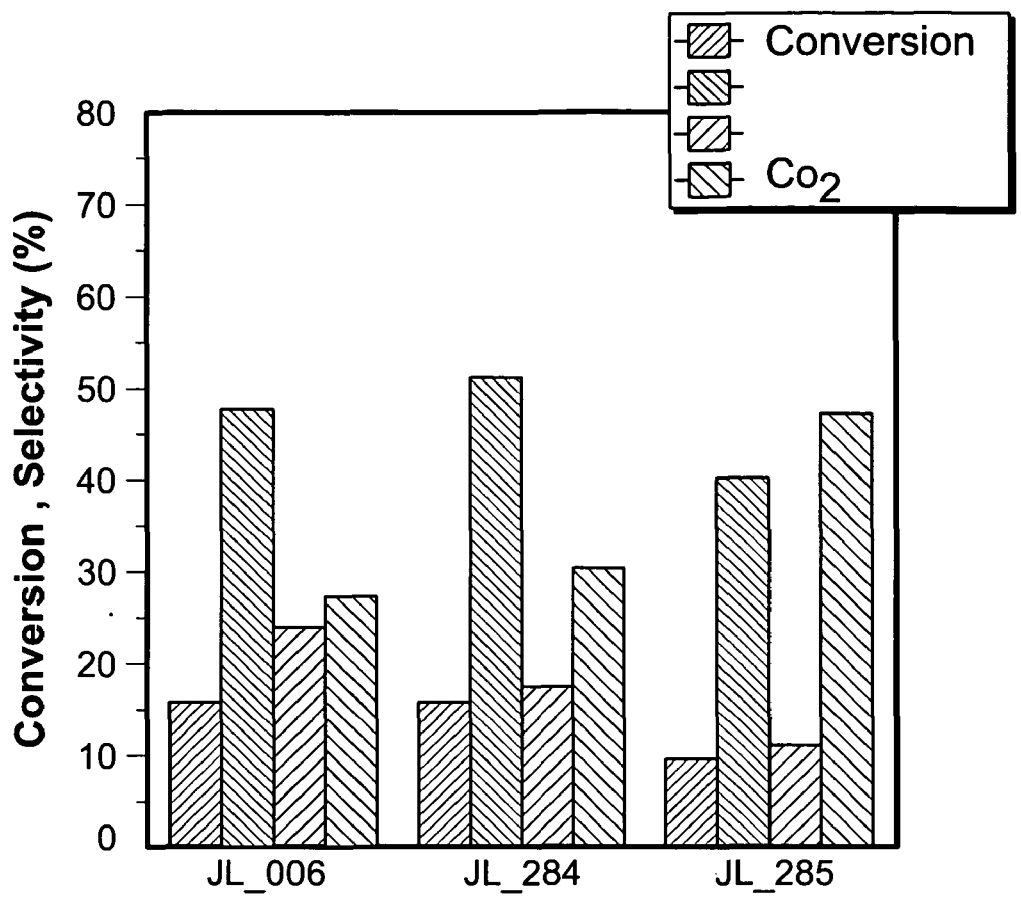
FIG. 8 is a chart illustrating the efficiency with which some exemplary catalysts convert propane to propene.

FIG. 8 demonstrates a selectivity to propylene of ~50% at a conversion of ~16% for JL__006. Upon addition of $Nb_2O_5$ (JL__284), the propylene selectivity increases slightly. With the addition of $WO_3$ (JL__285) the propylene selectivity decreases and more $CO_2$ is formed.

Example 4

Figure 9:
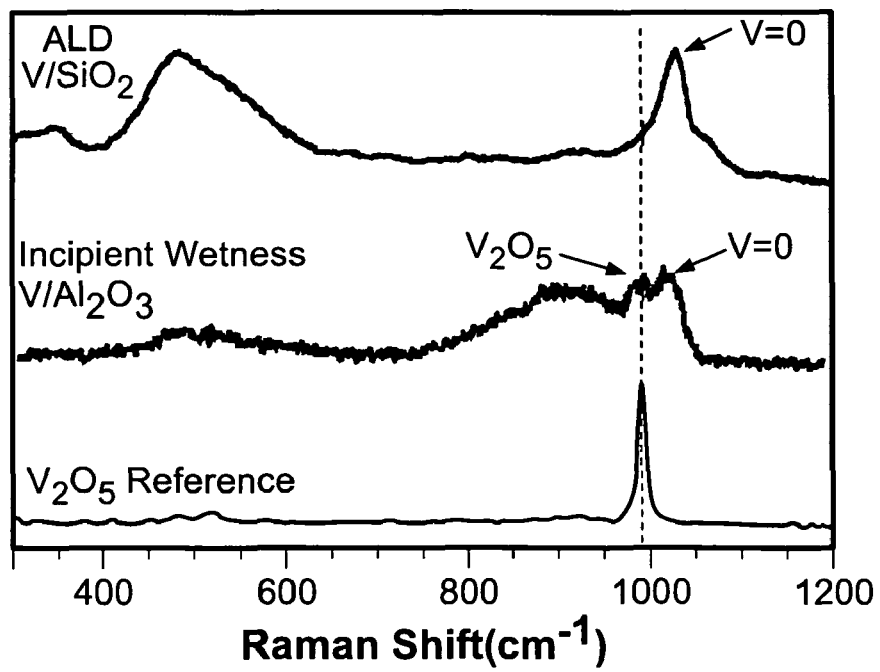
FIG. 9 is a Raman spectroscopy plot illustrating the Raman shift in an exemplary catalyst.

FIG. 9 illustrates a Raman spectroscopic analysis of a catalyst formed from atomic layer deposition of a $V_2O_5$ catalyst. The analysis illustrates that atomic layer deposition yields high dispersion at high loading.

Example 5

A fluidized bed catalytic reactor is formed as shown in FIG. 6 using a catalyst as described in Example 1. A propane tank delivers propane mixed with oxygen and diluted with nitrogen to a reaction chamber of the reactor. The propane is converted to propylene in a reaction that is catalyzed by the catalyst.

Example 6

A catalyst is formed as described in Example 1. The catalyst material of the catalyst includes only $Nb_2O_5$. The catalyst includes 12 cycles of $Nb_2O_5$.

Example 7

A catalyst is formed as described in Example 1. The catalyst material of the catalyst includes only $WO_3$. The catalyst includes 3 cycles of $WO_3$.

Example 8

A catalyst is formed as described in Example 1. The catalyst material of the catalyst includes alternating layers of $WO_3$ and $V_2O_5$. The catalyst includes 3 cycles of $WO_3$ and 1 cycle of $V_2O_5$.

Example 9

Figure 4:
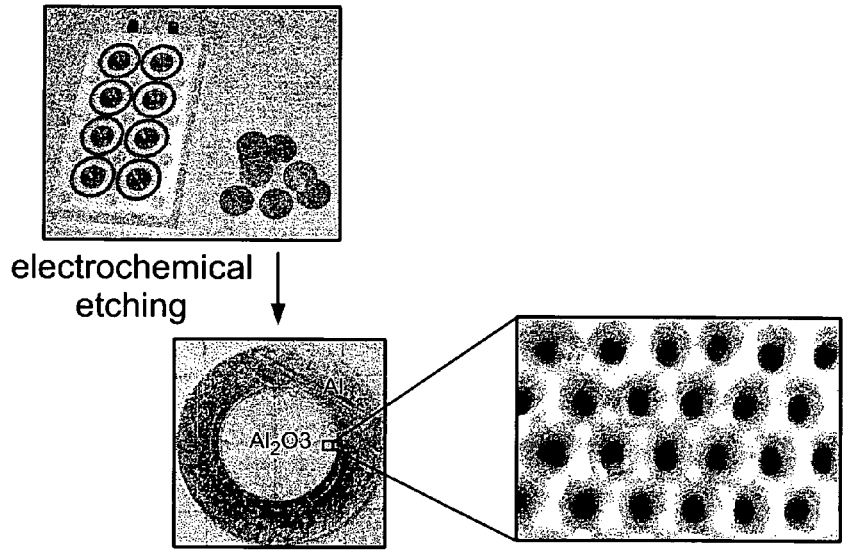
FIG. 4 is an illustration of a porous carrier body membrane according to one exemplary embodiment.
Figure 5A:
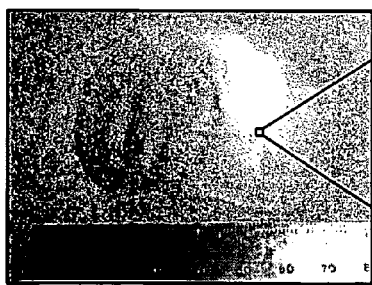
FIG. 5 is an illustration of a porous carrier body particle according to one exemplary embodiment.
Figure 5B:
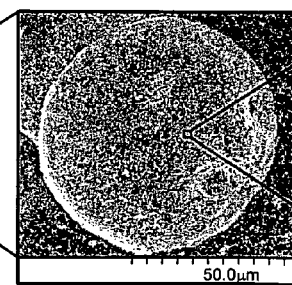
Figure 5C:
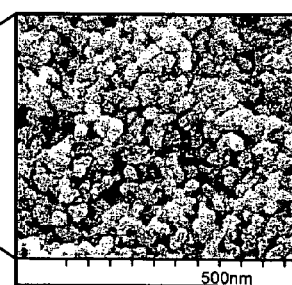

Another catalyst is formed as discussed above in Examples 1 and 2, except that an anodic aluminum oxide membrane having a structure prepared by the schematic flow diagram as show in FIG. 4 is used as the carrier substrate.

Example 10

A pass through reactor as shown in FIG. 7 is formed using the catalyst described in Example 9.

Example 11

A catalyst is formed as described in Example 1 except that alumina particles are used as the support carrier. The catalyst material of the catalyst includes alternating layers of $WO_3$ and $V_2O_5$. The catalyst includes 3 cycles of $WO_3$ and 1 cycle of $V_2O_5$.

Example 12

A catalyst is formed as described in Example 1 except that an anodized aluminum oxide membrane is used as the support carrier. The catalyst material of the catalyst includes alternating layers of $WO_3$ and $V_2O_5$. The catalyst includes 3 cycles of $WO_3$ and 1 cycle of $V_2O_5$.

Example 13

A catalyst is formed as described for embodiment JL__285 of Example 2 except that the support carrier particles are formed from silica on alumina. The silica is applied to the alumina by ALD.

Example 14

A catalyst is formed as described for embodiment JL__285 of Example 2 except that an anodized aluminum oxide membrane is used as the support carrier.

Example 15

The catalysts of Example 2 are used for the ammoxidation of propane to acrylonitrile.

Example 16

Additional exemplary catalysts are formed from catalysts and carrier supports as shown in the following chart. Wet impregnation involves dissolving a salt of the desired material into a solution (e.g., ammonium metavanadate for $V_2O_5$). Immerse the support in the solution, and evaporate the solvent. Then, calcine (heat in air) to produce the $V_2O_5$.

| Description | Support | Sample ID |
| --- | --- | --- |
| 3 cycles V (3% V) | CP8020 | JL__ALD__006 |
| 12 cycles Nb, 1 cycle V (1% V) | CP8020 | JL__284 |
| 12 cycles Nb, 1 cycle V, 1 cycle W | CP8020 | JL__285 |
| 12 cycles Nb | CP8020 | JL__296 |
| 12 cycles Nb, 1% V (wet impregnation) | CP8020 | JE__1260 |
| 12 cycles Nb, 3% V (wet impregnation) | CP8020 | JE__1261 |
| 12 cycles Nb | Silacycle | JL__314 |
| 12 cycles Nb, 1 cycle V | Silacycle | JL__315 |
| 12 cycles Nb, 2 cycles V | Silacycle | JL__316 |
| 12 cycles Nb, 4 cycles V | Silacycle | JL__317 |
| 12 cycles Nb, 2 cycle V, "1 ML" Mo (wet impregnation) | Silacycle | JL__320 |

Figure 12:
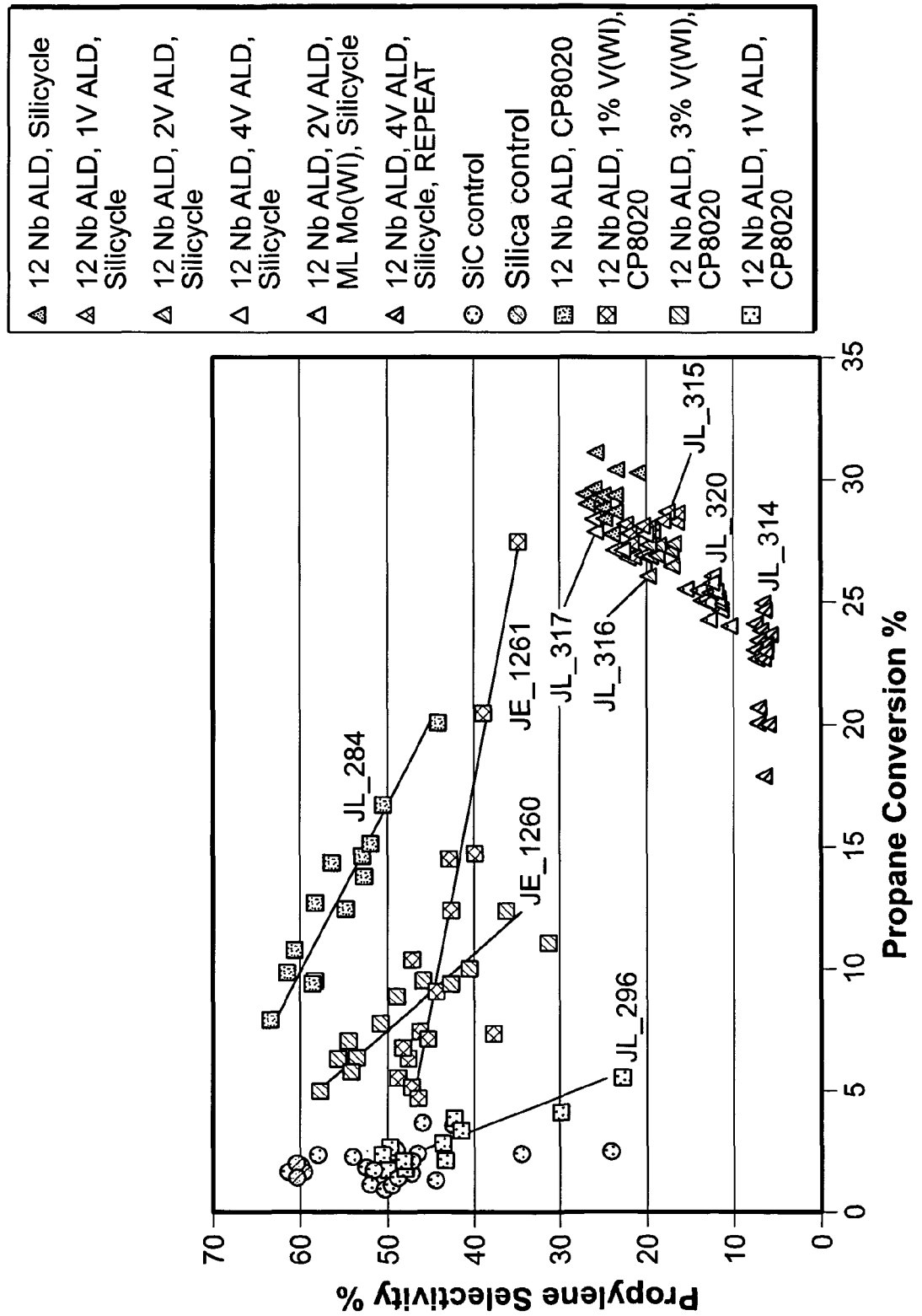
FIG. 12 is a chart illustrating the efficiency with which some exemplary catalysts convert propane to propene as well as data for controls.
Figure 13:
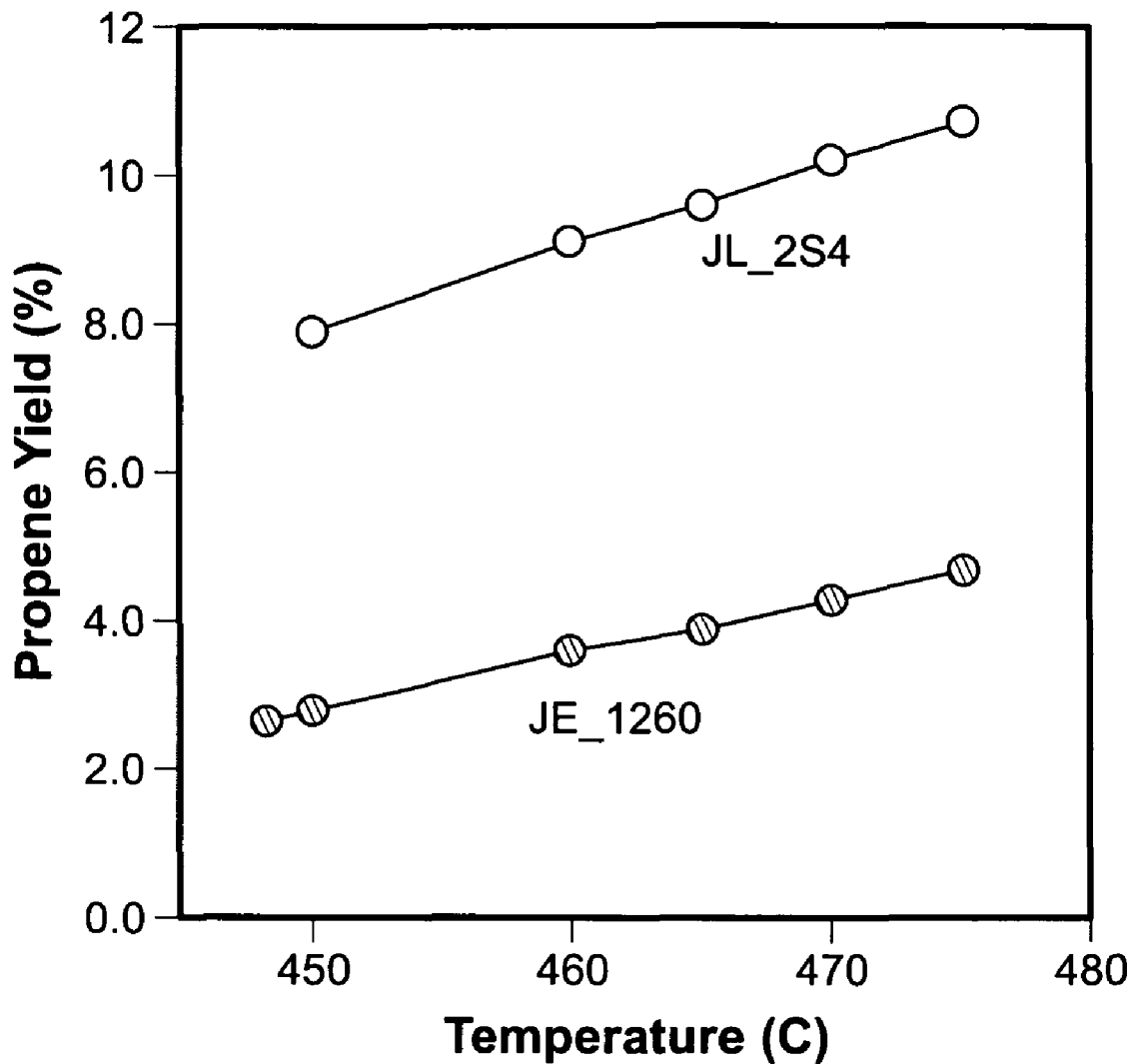
FIG. 13 is a chart illustrating the efficiency with which some exemplary catalysts convert propane to propene.

FIG. 12 illustrates the efficiency with which some of these catalysts convert propane to propene. Comparing JL__284 (ALD $V_2O_5$) and JE__1260 (wet impregnation $V_2O_5$), the ALD gives much higher selectivity than the conventional wet impregnation. See FIG. 13.

Figure 14A:
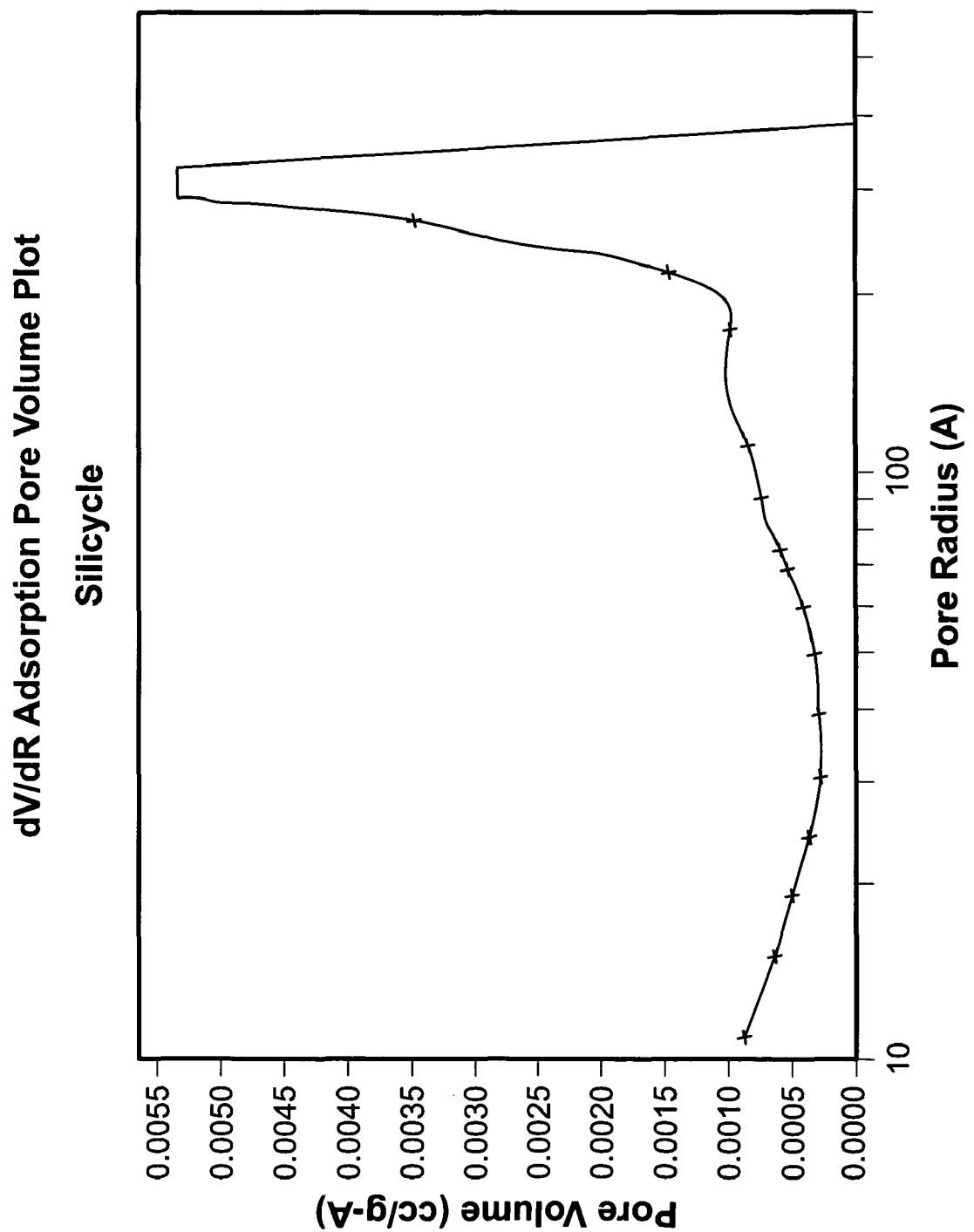
FIGS. 14A and 14B illustrate the pore size distribution for two exemplary carrier bodies—Silacycle and CP8020.
Figure 14B:
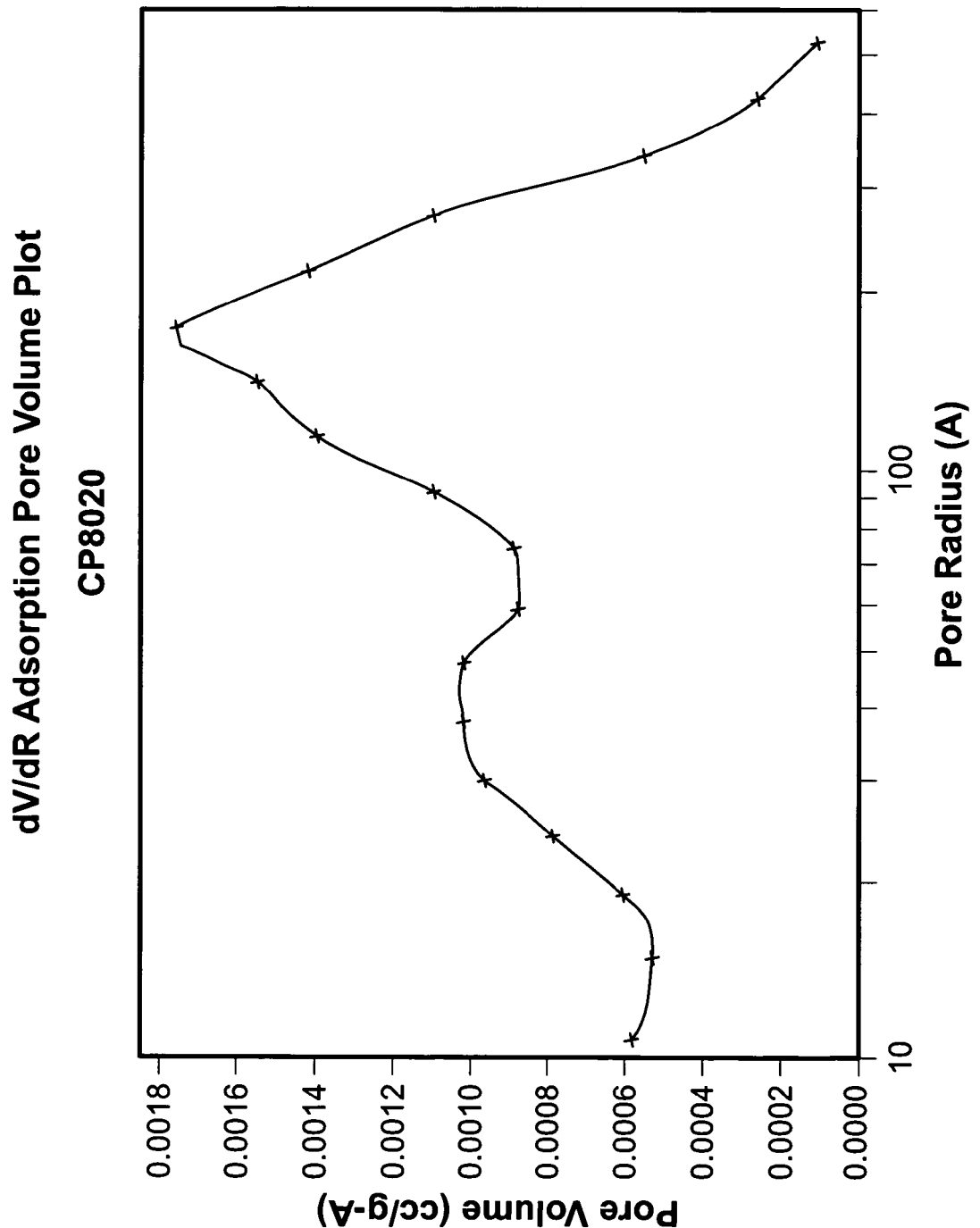

All of the samples on CP8020 give higher selectivity than the equivalent samples on Silicycle. These 2 supports are nearly equivalent except for the pore size distribution. Silicycle S10040M is 100 $m^2/g$, 75-200 micron primary particles, and 30 nm average pore diameter and CP8020 is 80 $m^2/g$, about 100 micron primary particles, and about 30 nm average pore diameter. FIG. 14A illustrates the pore size distribution for Silacycle and FIG. 14B illustrates the pore size distribution for CP8020. Note that CP8020 has a bimodal pore size distribution.

The foregoing description of embodiments of the present invention has been presented for purposes of illustration and description. It is not intended to be exhaustive or to limit the present invention to the precise form disclosed, and modifications and variations are possible in light of the above teachings or may be acquired from practice of the present invention. The embodiments were chosen and described in order to explain the principles of the present invention and its practical application to enable one skilled in the art to utilize the present invention in various embodiments, and with various modifications, as are suited to the particular use contemplated.

What is claimed is:
1. A catalyst comprising:
a carrier body; and a catalytic portion carried by the carrier body, the catalytic portion comprising a plurality of distinct layers of a catalytic material, each of the plurality of distinct layers of the catalytic material including a transition metal oxide and having an average thickness of between about 0.01 nm and about 500 nm, wherein the plurality of distinct layers of catalytic material comprise a plurality of different transition metal oxides, and wherein the catalyst is configured to catalyze at least one of a dehydrogenation reaction and an ammoxidation reaction.

2. The catalyst of claim 1, wherein the carrier body is porous, and wherein the catalytic portion is disposed on a plurality of pore surfaces.

3. The catalyst of claim 2, wherein the pores of the carrier body have a mean pore size that is between about 0.1 nm and about 1 µm.

4. The catalyst of claim 3, wherein the carrier body consists essentially of a ceramic material having a surface area of at least about 1 $m^2/g$.

5. The catalyst of claim 1, wherein at least one of the plurality of different transition metal oxides is selected from the group consisting of: $V_2O_5$, $WO_3$, $MoO_3$, $NbO_2$, $TiO_2$, $Al_2O_3$, $MgO$, and $ZrO_2$.

6. The catalyst of claim 5, wherein the plurality of distinct layers include at least three different transition metal oxides.

7. The catalyst of claim 1, wherein at least a first layer of the plurality of layers of catalytic material comprises a vanadium oxide based catalytic material, and wherein at least a second layer of the plurality of layers of catalytic material comprises a niobium oxide based catalytic material.

8. The catalyst of claim 6, wherein at least a third layer of the plurality of layers of catalytic material comprises a tungsten oxide based catalytic material.

9. The catalyst of claim 6, wherein the catalyst is substantially characterized by an oxidative dehydrogenation of propane to propylene with a selectivity to propylene of at least about 50 percent and a conversion rate of at least about 10 percent.

10. The catalyst of claim 1, wherein the average thickness of each of the plurality of distinct layers of catalytic material is between about 1 nm and about 100 nm.

11. The catalyst of claim 1, wherein the catalytic portion substantially conforms to a shape of the carrier body.

12. A method for forming a catalyst comprising:
providing a carrier body;
depositing a catalytic material on the carrier body comprising a plurality of transition metal oxides;
wherein depositing a catalytic material on the carrier body comprises depositing a plurality of layers of the catalytic material, on the carrier body one layer at a time, wherein at least one layer of the plurality of layers comprises a first transition metal oxide and at least another layer comprises a second transition metal oxide, and wherein the catalyst is configured to catalyze at least one of a dehydrogenation reaction and an ammoxidation reaction.

13. The method of claim 12, wherein depositing one layer of the catalytic material comprises providing a metal-based precursor to the carrier body, and oxidizing the metal-based precursor to form the catalytic material.

14. The method of claim 13, wherein providing a metal-based precursor to the carrier body comprises providing the metal-based precursor to a carrier body that comprises at least one layer of catalytic material that has been deposited on the carrier body.

15. The method of claim 13, wherein the first and second transition metal oxides are selected from the group consisting of: $V_2O_5$, $WO_3$, $MoO_3$, $NbO_2$, $TiO_2$, $Al_2O_3$, $MgO$, and $ZrO_2$.

16. The method of claim 12, wherein depositing one layer of the catalytic material comprises wet impregnation.

17. A reactor comprising:
a reactor tank comprising an inlet port configured to receive reactants and an outlet port configured to allow reacted products to leave the reactor tank;
a reactant source configured to provide a source of short chain alkane reactants to the reactor; and
a catalyst disposed within the reactor, the catalyst comprising:
a carrier body; and
a catalytic portion carried by the carrier body, the catalytic portion including a plurality of distinct layers of a catalytic material, each of the plurality of distinct layers of the catalytic material including a transition metal oxide, at least one of the plurality of layers including a first transition metal oxide and at least another of the plurality of layers including a second transition metal oxide,
wherein the catalyst is configured to catalyze a conversion of an alkane reactant to an alkene product, wherein the catalyst has a selectivity of at least about 45 percent for the conversion of the alkane reactant to the alkene product.

18. The reactor of claim 17, wherein the reactor is configured to fluidize the catalyst in the reactor.

19. The reactor of claim 17, wherein the carrier body comprises a plurality porous particles having a mean pore size of at least about 0.1 nm and a surface area of at least about 1 $m^2/g$.

20. The reactor of claim 17, wherein the transition metal oxides are selected from the group consisting of: $V_2O_5$, $WO_3$, $MoO_3$, $NbO_2$, $TiO_2$, $Al_2O_3$, $MgO$, and $ZrO_2$.

* * * * *